(12) United States Patent
Hicks et al.

(10) Patent No.: US 11,543,849 B2
(45) Date of Patent: Jan. 3, 2023

(54) INTEGRATED CLOCK GATER LATCH STRUCTURES WITH ADJUSTABLE OUTPUT RESET

(71) Applicant: Samsung Electronics Co., Ltd., Suwon-si (KR)

(72) Inventors: Kenneth Hicks, Austin, TX (US); Sumeer Goel, Austin, TX (US); Andrew Christopher Russell, Austin, TX (US)

(73) Assignee: SAMSUNG ELECTRONICS CO., LTD.

( * ) Notice: Subject to any disclaimer, the term of this patent is extended or adjusted under 35 U.S.C. 154(b) by 332 days.

(21) Appl. No.: 16/504,215

(22) Filed: Jul. 5, 2019

(65) Prior Publication Data

US 2020/0333824 A1 Oct. 22, 2020

Related U.S. Application Data

(60) Provisional application No. 62/837,182, filed on Apr. 22, 2019.

(51) Int. Cl.
*G06F 1/04* (2006.01)
*H03K 3/356* (2006.01)
*H03K 3/037* (2006.01)
*H03K 3/012* (2006.01)

(52) U.S. Cl.
CPC .............. *G06F 1/04* (2013.01); *H03K 3/012* (2013.01); *H03K 3/037* (2013.01); *H03K 3/0375* (2013.01); *H03K 3/356008* (2013.01)

(58) Field of Classification Search
CPC ...... H03K 3/012; H03K 3/037; H03K 3/0375; H03K 3/356–356026; H03K 3/356086; H03K 3/356095; H03K 3/356104–356121; H03K 3/356182; H03K 3/356191; G06F 1/04
See application file for complete search history.

(56) References Cited

U.S. PATENT DOCUMENTS

| | | | |
|---|---|---|---|
| 5,764,089 A * | 6/1998 | Partovi | H03K 3/037 327/200 |
| 7,742,551 B2 | 6/2010 | Pyeon | |
| 8,570,069 B2 | 10/2013 | Zid et al. | |
| 8,599,642 B2 * | 12/2013 | Bunce | G11C 11/419 365/233.12 |
| 9,564,901 B1 * | 2/2017 | Chow | H03K 19/01855 |
| 9,625,938 B2 | 4/2017 | Thazhatheppattu et al. | |
| 9,966,953 B2 * | 5/2018 | Ye | H03K 3/037 |
| 10,784,864 B1 * | 9/2020 | Berzins | G06F 1/3237 |

* cited by examiner

*Primary Examiner* — Patrick O Neill
(74) *Attorney, Agent, or Firm* — Renaissance IP Law Group LLP

(57) ABSTRACT

According to one general aspect, an apparatus may include a latch circuit configured to, depending in part upon a state of an enable signal, substantially pass the first clock signal to an output signal. The latch circuit may include at least two transistors configured to essentially perform a NAND function and controlled by a second clock signal, wherein the at least two transistors are configured to alter the timing of the substantial passing of the first clock signal to the output signal.

8 Claims, 10 Drawing Sheets

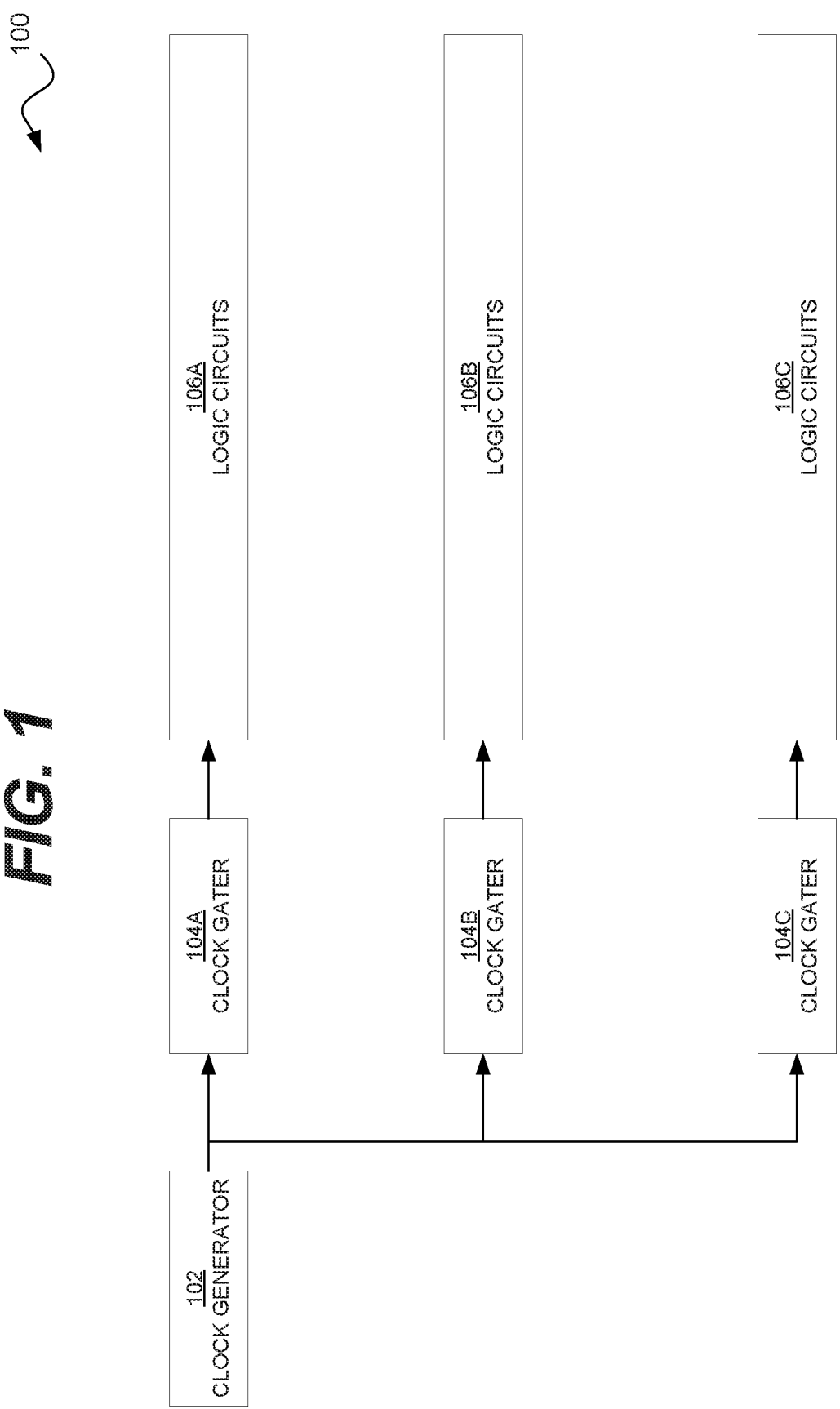

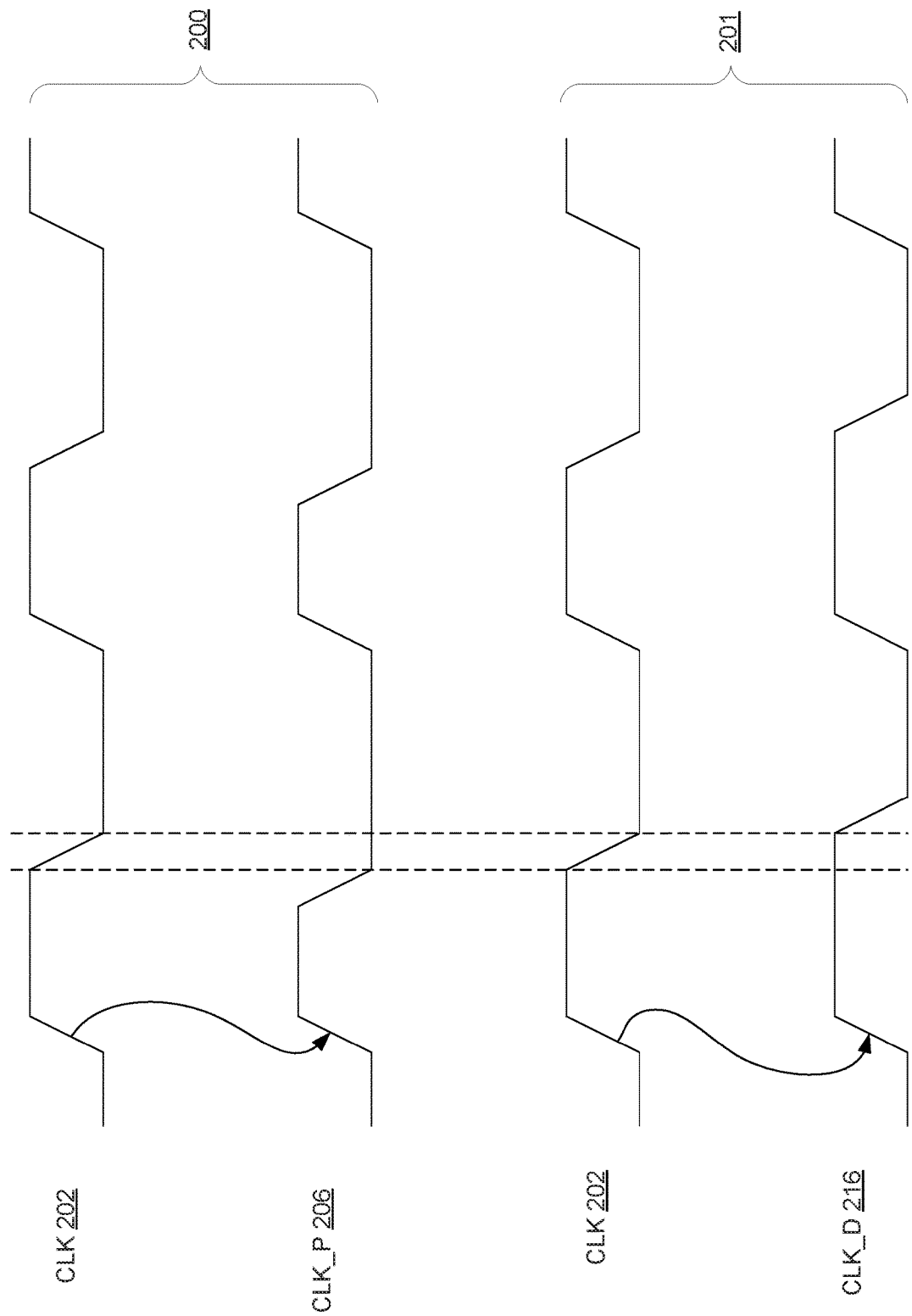

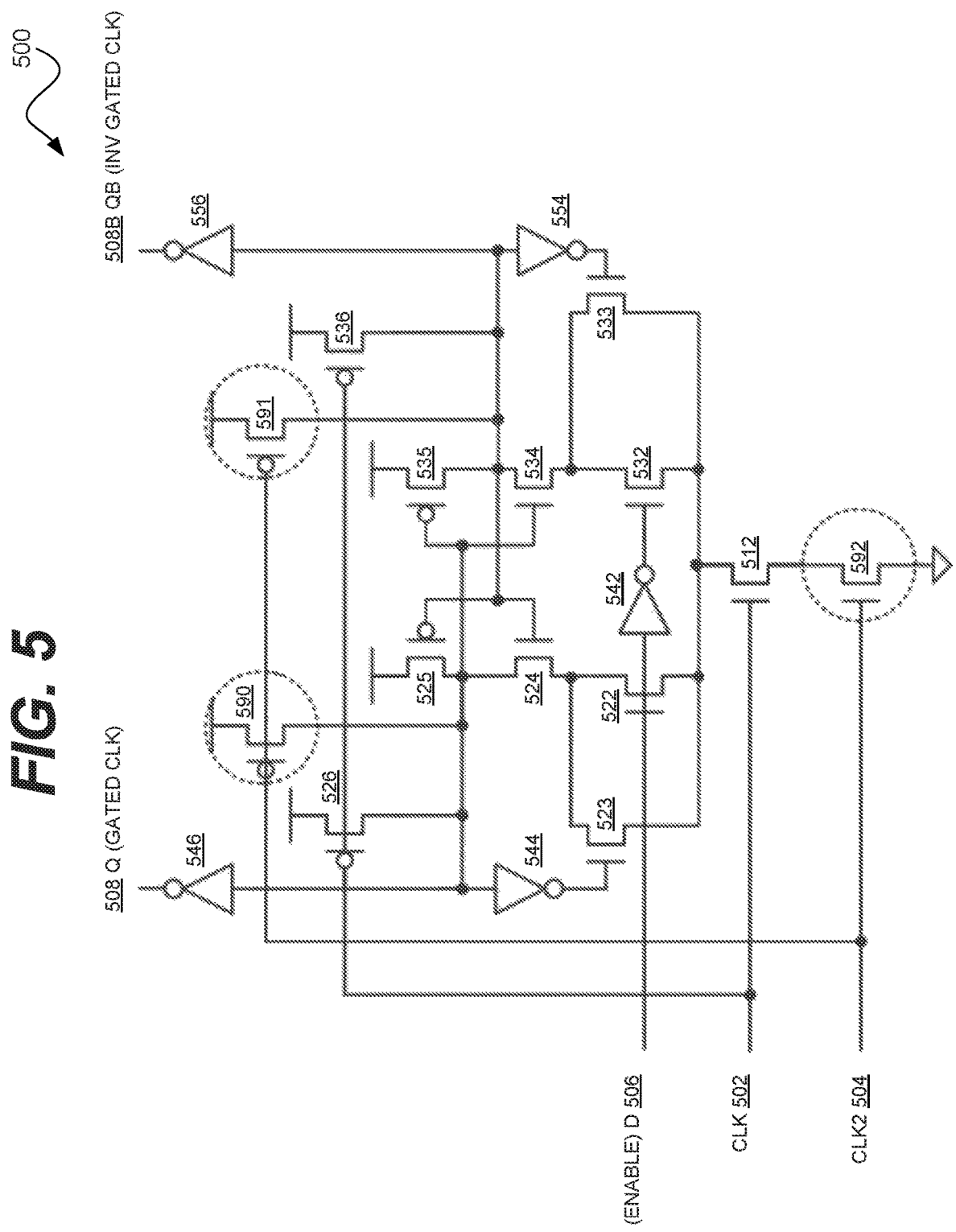

INTEGRATED CLOCK GATER LATCH STRUCTURES WITH ADJUSTABLE OUTPUT RESET

CROSS-REFERENCE TO RELATED APPLICATION

This application claims priority under 35 U.S.C. § 119 to Provisional Patent Application Ser. No. 62/837,182, entitled "INTEGRATED CLOCK GATER LATCH STRUCTURES WITH ADJUSTABLE OUTPUT RESET" filed on Apr. 22, 2019. The subject matter of this earlier filed application is hereby incorporated by reference.

TECHNICAL FIELD

This description relates to clock management and more specifically to integrated clock gater latch structures with adjustable output reset.

BACKGROUND

Clock gating is a popular technique used in many synchronous circuits for reducing dynamic power dissipation. Clock gating saves power by adding more logic to a circuit to prune the clock tree. Pruning the clock disables portions of the circuitry so that the flip-flops in them do not have to switch states. Switching states consumes power. When not being switched, the switching power consumption goes to zero, and only leakage currents are incurred.

In electronics, a flip-flop is a circuit that has two stable states and can be used to store state information. A flip-flop is a bi-stable multi-vibrator. The circuit can be made to change state by signals applied to one or more control inputs and will have one or two outputs. It is the basic storage element in sequential logic. Flip-flops and latches are fundamental building blocks of digital electronics systems used in computers, communications, and many other types of systems.

SUMMARY

According to one general aspect, an apparatus may include a latch circuit configured to, depending in part upon a state of an enable signal, substantially pass the first clock signal to an output signal. The latch circuit may include at least two transistors configured to essentially perform a NAND function and controlled by a second clock signal, wherein the at least two transistors are configured to alter the timing of the substantial passing of the first clock signal to the output signal.

According to another general aspect, an apparatus may include a latch circuit configured to, depending in part upon a state of an enable signal, create an output signal that substantially mimics a first clock signal. The latch circuit may include at least two transistors configured to essentially perform a NOR function and controlled by a second clock signal, wherein the at least two transistors are configured to alter the timing, relative to a trialing edge of the first clock signal, of a trailing edge of the output signal.

According to another general aspect, a system may include a clock generator circuit configured to generate a first clock signal. The system may include a clock gater circuit configured to receive the first clock signal, a second clock signal, and an enable signal as input, and generate a third clock signal. The system may include a logic circuit configured to perform a logic function synchronized, at least in part by the third clock signal. Wherein the clock gater circuit is configured to, depending in part upon a state of the enable signal, substantially pass the first clock signal to the third clock signal. The clock gater circuit may include at least two transistors configured to be controlled by the second clock signal and alter the timing of the substantial passing of the first clock signal to the output signal.

The details of one or more implementations are set forth in the accompanying drawings and the description below. Other features will be apparent from the description and drawings, and from the claims.

A system and/or method for clock management and more specifically to integrated clock gater latch structures with adjustable output reset, substantially as shown in and/or described in connection with at least one of the figures, as set forth more completely in the claims.

BRIEF DESCRIPTION OF THE DRAWINGS

FIG. 1 is a block diagram of an example embodiment of a system in accordance with the disclosed subject matter.

FIG. 2 is a timing diagram of an example embodiment of signals in accordance with the disclosed subject matter.

FIG. 5 is a block diagram of an example embodiment of a system in accordance with the disclosed subject matter.

Like reference symbols in the various drawings indicate like elements.

DETAILED DESCRIPTION

Figure 3A:
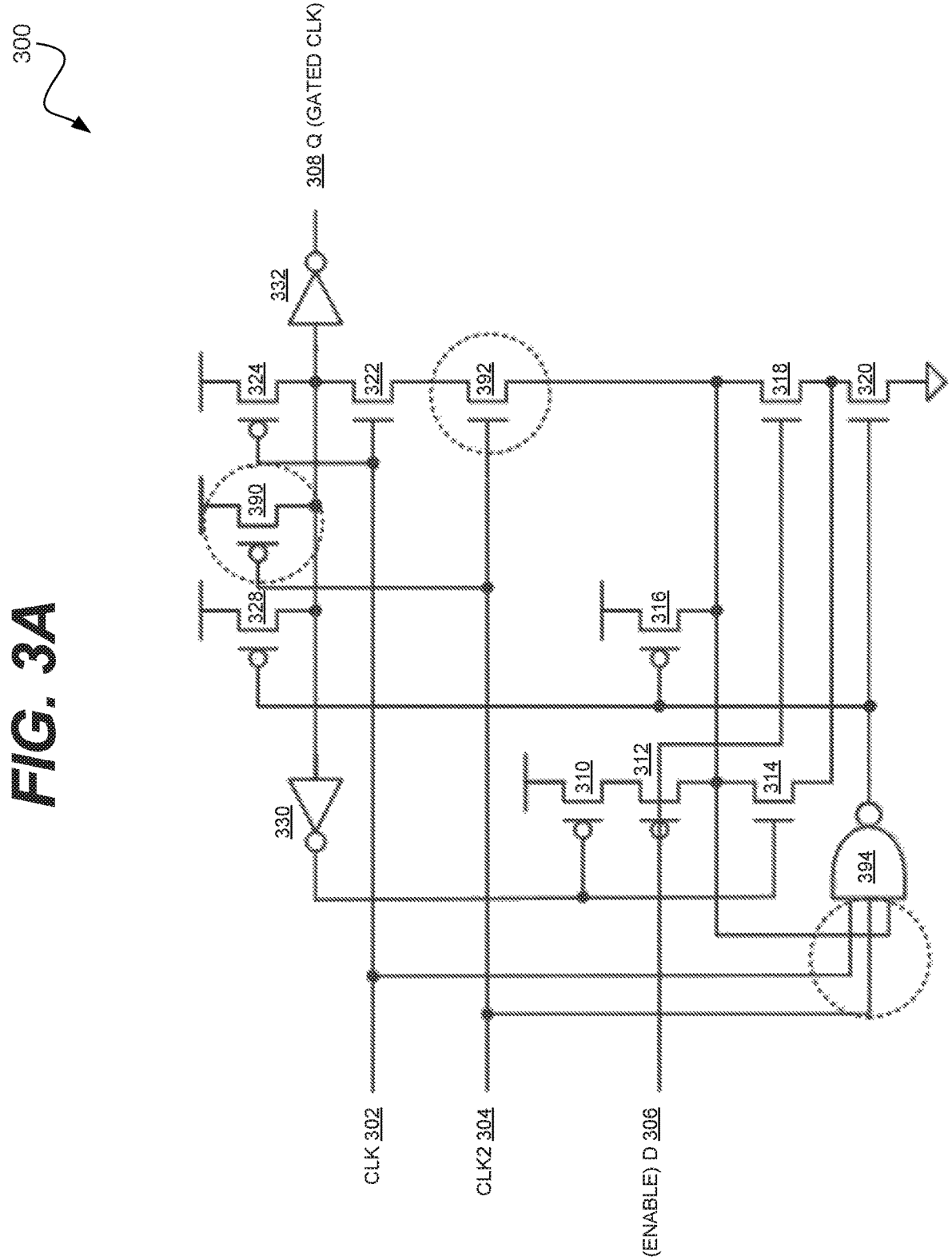
FIGS. 3A and 3B are a block diagrams of an example embodiment of a system in accordance with the disclosed subject matter.

Various example embodiments will be described more fully hereinafter with reference to the accompanying drawings, in which some example embodiments are shown. The present disclosed subject matter may, however, be embodied in many different forms and should not be construed as limited to the example embodiments set forth herein. Rather, these example embodiments are provided so that this disclosure will be thorough and complete, and will fully convey the scope of the present disclosed subject matter to those skilled in the art. In the drawings, the sizes and relative sizes of layers and regions may be exaggerated for clarity.

It will be understood that when an element or layer is referred to as being "on," "connected to" or "coupled to" another element or layer, it may be directly on, connected or coupled to the other element or layer or intervening elements or layers may be present. In contrast, when an element is referred to as being "directly on", "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third, and so on may be used herein to describe various elements, components, regions, layers and/or sections, these elements, components, regions, layers and/or sections should not be limited by these terms. These terms are only used to distinguish one element, component, region, layer, or section from another region, layer, or section. Thus, a first element, component, region, layer, or section discussed below could be termed a second element, component, region, layer, or section without departing from the teachings of the present disclosed subject matter.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" may encompass both an orientation of above and below. The device may be otherwise oriented (rotated 90 degrees or at other orientations) and the spatially relative descriptors used herein interpreted accordingly.

Likewise, electrical terms, such as "high" "low", "pull up", "pull down", "1", "0" and the like, may be used herein for ease of description to describe a voltage level or current relative to other voltage levels or to another element(s) or feature(s) as illustrated in the figures. It will be understood that the electrical relative terms are intended to encompass different reference voltages of the device in use or operation in addition to the voltages or currents depicted in the figures. For example, if the device or signals in the figures are inverted or use other reference voltages, currents, or charges, elements described as "high" or "pulled up" would then be "low" or "pulled down" compared to the new reference voltage or current. Thus, the exemplary term "high" may encompass both a relatively low or high voltage or current. The device may be otherwise based upon different electrical frames of reference and the electrical relative descriptors used herein interpreted accordingly.

The terminology used herein is for the purpose of describing particular example embodiments only and is not intended to be limiting of the present disclosed subject matter. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present disclosed subject matter.

Unless otherwise defined, all terms (including technical and scientific terms) used herein have the same meaning as commonly understood by one of ordinary skill in the art to which this disclosed subject matter belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, example embodiments will be explained in detail with reference to the accompanying drawings.

FIG. 1 is a block diagram of an example embodiment of a system 100 in accordance with the disclosed subject matter. In various embodiments, the system 100 may include a computing device, such as, for example, a processor, a system-on-a-chip (SoC), a laptop, desktop, workstation, personal digital assistant, smartphone, tablet, and other appropriate computers or a virtual machine or virtual computing device thereof.

In the illustrated embodiment, the system 100 may include a clock generator circuit 102 configured to generate a clock signal. That clock signal may then be distributed throughout the system 100. In various embodiments, this may involve a mesh or a tree structure.

In the illustrated embodiment, the system 100 may include a number of integrated clock gater (ICG) or clock gater circuits 104 (e.g., circuits 104A, 104B, and 104C). In various embodiments, these ICGs 104 may be configured to stop or halt the clock signal based upon one or more enable signals (not shown).

In the illustrated embodiment, the system 100 may include one or more logic circuits 106 (e.g., circuits 106A, 106B, and 106C), configured to perform a task. In various embodiments, these logic circuits 106 may include execution units (e.g., load/store units, arithmetic logic units, floating point, units, etc.), function unit block (FUB), combinatorial logic blocks (CLBs), or sub-portions thereof.

As described above, in various embodiments, the ICGs 104 may be configured to turn off the clock (and therefore the switching and power consumption) to a logic circuit 106. In various embodiments, these ICGs 104 may be integrated into or as part of the respective logic circuits 106.

In various embodiments, the ICGs 104 may also be configured to shape the clock signal, as well as gate it. Traditionally, ICG structures use additional gates in the critical timing path to accomplish the desired timing adjustment. As shown in the later figures, the ICGs 104, in the illustrated embodiment, do not include extra gates in the critical timing path.

FIG. 2 is a timing diagram of an example embodiment of signals in accordance with the disclosed subject matter. In various embodiments, these signals may be produced by the system 100 of FIG. 1 or the various other systems of the later figures.

In various embodiments, it may be desirable to alter the timing of the clock signal 202. In general, the clock signal rises and falls at a predicable rate with a nominal duty cycle of 50%. Although, it is understood that the above is merely one illustrative example to which the disclosed subject matter is not limited.

As described above, input and output signals (control or data signals) are latched or output by a flip-flop on the rising or falling edge of the clock 202. In various embodiments, it may be desirable to move on of those edges (e.g., the falling edge as shown) to accommodate timing requirements of the logic circuits.

In the embodiments 200 and 201 the clock signal 202 may be input into an ICG. The ICG may then adjust the timing of the clock signal 202 based upon the timing requirements of the overall system, and output an adjusted clock signal (e.g., signals 206 or 216).

In the illustrated embodiment of signals 200, the falling edge of the clock signal 202 is pulled in or occurs sooner (signal CLK_P 206) by the ICG. The output signal 206 may then be used by the logic circuits instead of the raw clock signal 202. Generating an early reset to the falling edge may give the logic circuits extra time to complete their task or make other timing adjustments for the betterment of the overall system. In one embodiment, the delayed reset may be used to decrease the power consumption of a circuit. For example, in a memory array circuit, a wordline signal may be based upon a pulled in clock signal, so that it resets earlier. The state of the wordline may control the discharge of the bitline, and the sooner the wordline resets, the sooner the bitline stops discharging. As such, a more quickly reset wordline signal (controlled by CLK_P 206) may stop or arrest unnecessary discharging of the bitline. It is understood that the above are merely a few illustrative examples to which the disclosed subject matter is not limited.

In the illustrated embodiment of signals 201, the falling edge of the clock signal 202 is delayed occurs later (signal CLK_D 216) by the ICG. The output signal 216 may then be used by the logic circuits instead of the raw clock signal 202. Generating a late reset to the falling edge may give the inputs to the logic circuits extra time to settle or stabilize, or make other timing adjustments for the betterment of the overall system. In one embodiment, the delayed reset may be used to decrease the power consumption of a circuit. For example, in a memory array circuit, a bitline precharge signal may be based upon a delayed clock (e.g., CLK_D 216) such that it occurs after a wordline signal (based upon a non-delayed clock). It is understood that the above are merely a few illustrative examples to which the disclosed subject matter is not limited.

Figure 3B:
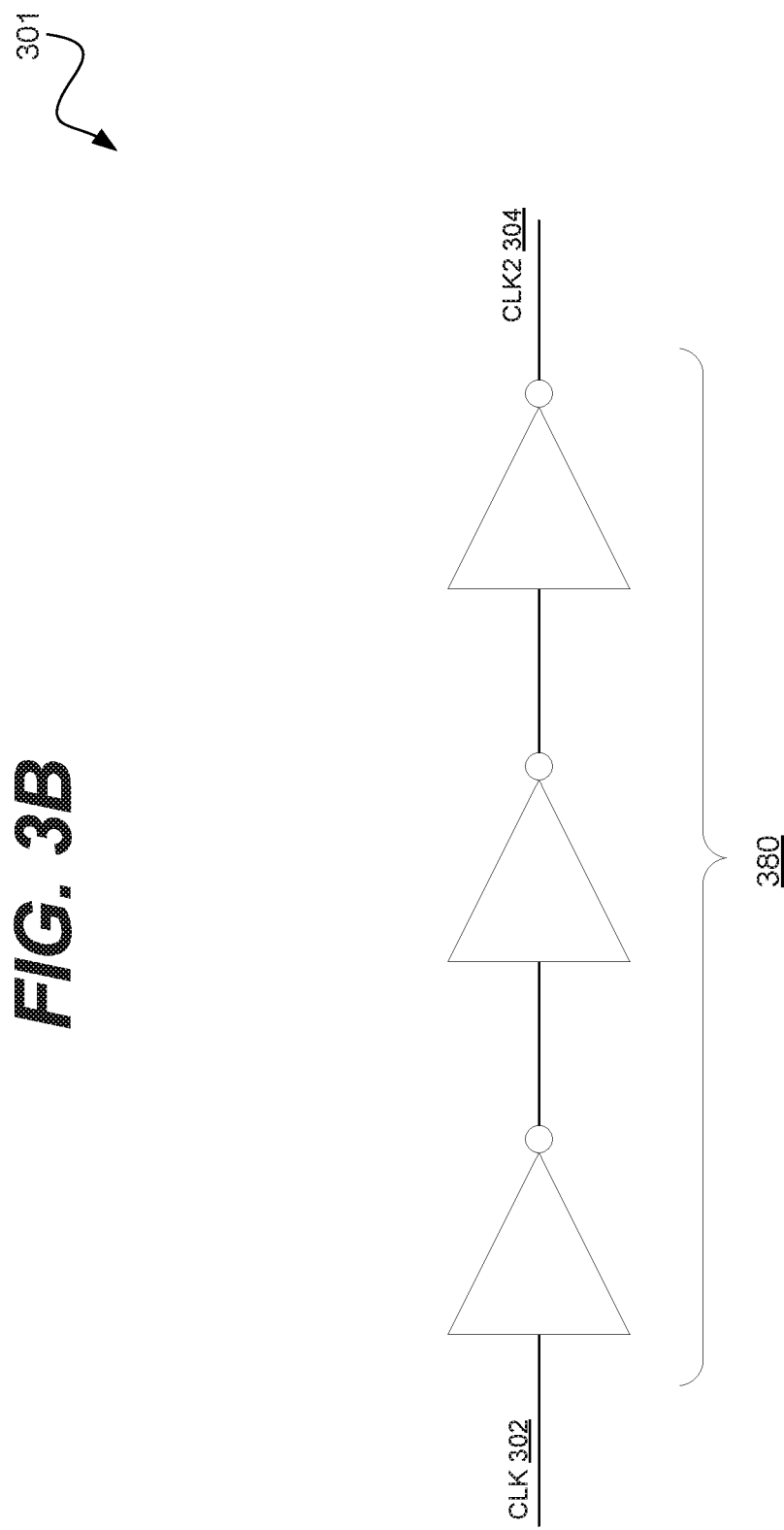

FIGS. 3A and 3B are a block diagrams of an example embodiment of a system 300 and circuit 301 in accordance with the disclosed subject matter. In the illustrated embodiment, the system 300 may include a B-latch ICG that is configured to pull-in the falling edge of a clock.

In this context, a "B-latch gater" captures or latches the input data at the rising edge of the clock signal, and holds it during the "high" or "A" clock phase. When clock falls, the output resets or pre-charges during the "low" or "B" clock phase. Conversely, an "A-latch gater" captures or latches the input data at the falling edge of the clock signal, and holds it during the "low" or "B" clock phase. When clock rises, the output resets or pre-charges during the "high" or "A" clock phase.

In the illustrated embodiment of FIG. 3A, the system 300 includes a circuit that incorporates a self-timed delay off the rising edge of the clock (CLK) 302 to the falling edge of the output Q 308. In such an embodiment, CLK 302 may be essentially or substantially passed to the output Q 308, with timing alterations. In this case, the timing alteration being that falling edge of output Q 308 is pulled in, similarly to the signals 200 of FIG. 2. In the illustrated embodiment, two wholly new devices (transistors 390 and 392) have been added. In addition, a third input to the NAND gate 394 has also been added, but this is a modification of a pre-existing structure. In various embodiments, the additions to the NAND gate 392 (or NOR gate, in some embodiments) may include two additional transistors.

In the illustrated embodiment, a traditional B-latch may include as an input the signal D 306 and as an output the signal Q 308. This latch 300 may be controlled by the clock 302, and the latch 300 may gate CLK 302 (as output Q 308) based, at least in part, upon the input enable D 306, as described above. In such an embodiment, the input D 306 may be an enable signal, and the output Q 308 may be a gated version of CLK 302 (based upon the enable D 306, CLK 302, and CLK2 304).

The B-latch 300 may include the following circuits: PMOS (p-channel metal-oxide-semiconductor field-effect transistor) 310, 312, 316, 324, and 328; NMOS (n-channel metal-oxide-semiconductor field-effect transistor) 314, 318, 320, and 322; inverters 330 and 332; and NAND gate 394.

In the illustrated embodiment, the latch 300 may also include a second clock (CLK2) 304. CLK2 304 may be a delayed or altered version of CLK 302. In another embodiment, the signal CLK2 304 may not be directly related to CLK 302. It is understood that the above are merely a few illustrative examples to which the disclosed subject matter is not limited.

In the illustrated embodiment, the second clock CLK2 304 may act as a third input to the NAND gate 394 (along with CLK 302 and input D 306). In addition, the latch 300 may also include two transistors 390 and 392 that are controlled by the second clock CLK2 304 (i.e., coupled with the gate terminal). In the illustrated embodiment, the two transistors 390 and 392 are not in the critical timing path of the latch 300 (CLK 302 to Q 308), and therefore do not create extra delay for the latch 300, overall.

In the illustrated embodiment, the transistor 390 may include a PMOS transistor coupled between the (high) voltage supply (Vdd) and the inverse of the output Q 308 (the input to inverter 332). The transistor 390 may also be coupled in parallel with the transistors 328 and 324.

The transistor 392 may include an NMOS transistor coupled between the inverse of the output Q 308 (the input to inverter 332) and the ground (or low voltage supply, Vss). The transistor 392 may be coupled in series with the transistors 318, 320, and 322.

In the illustrated embodiment, the transistors 390 and 392 may be configured to essentially perform a NAND function. While they are not arranged as a traditional NAND gate, the transistors 390 and 392 may be coupled in such a way that unless both CLK 302 (controlling transistors 322 and 324) and CLK2 304 (controlling transistors 390 and 392) have the same state, then CLK 302 will not be passed to output Q 308. In the illustrated embodiment, the transistors 390 and 392 may be configured to reset the falling edge of the output signal Q 308. In various embodiments, this may be responsive or triggered by the rising edge of CLK 302, if CLK2 304 is derived (e.g., an inverse) of CLK 302. It is understood that the above is merely one illustrative example to which the disclosed subject matter is not limited.

FIG. 3B illustrates an example circuit 301 for creating the second clock signal CLK2 304. It is understood that the above is merely one illustrative example to which the disclosed subject matter is not limited.

In the illustrated embodiment, the second clock signal CLK2 304 may be created from the first clock signal CLK 302. In such an embodiment, the first clock signal CLK 302 may be delayed by an odd number of inverters 380, such that the second clock signal CLK2 304 is substantially inverted from the first clock signal CLK 302. In such an embodiment, and ignoring delay, the CLK2 signal 304 may be high when the CLK signal 302 is low and vice versa. In various embodiments, the number of inverters 380 may be adjusted to reach a desired delay or adjust the timing. In such an embodiment, the timing of the resetting of the output signal Q 308 may be adjusted. Again, it is understood that the above is merely one illustrative example to which the disclosed subject matter is not limited.

Figure 4A:
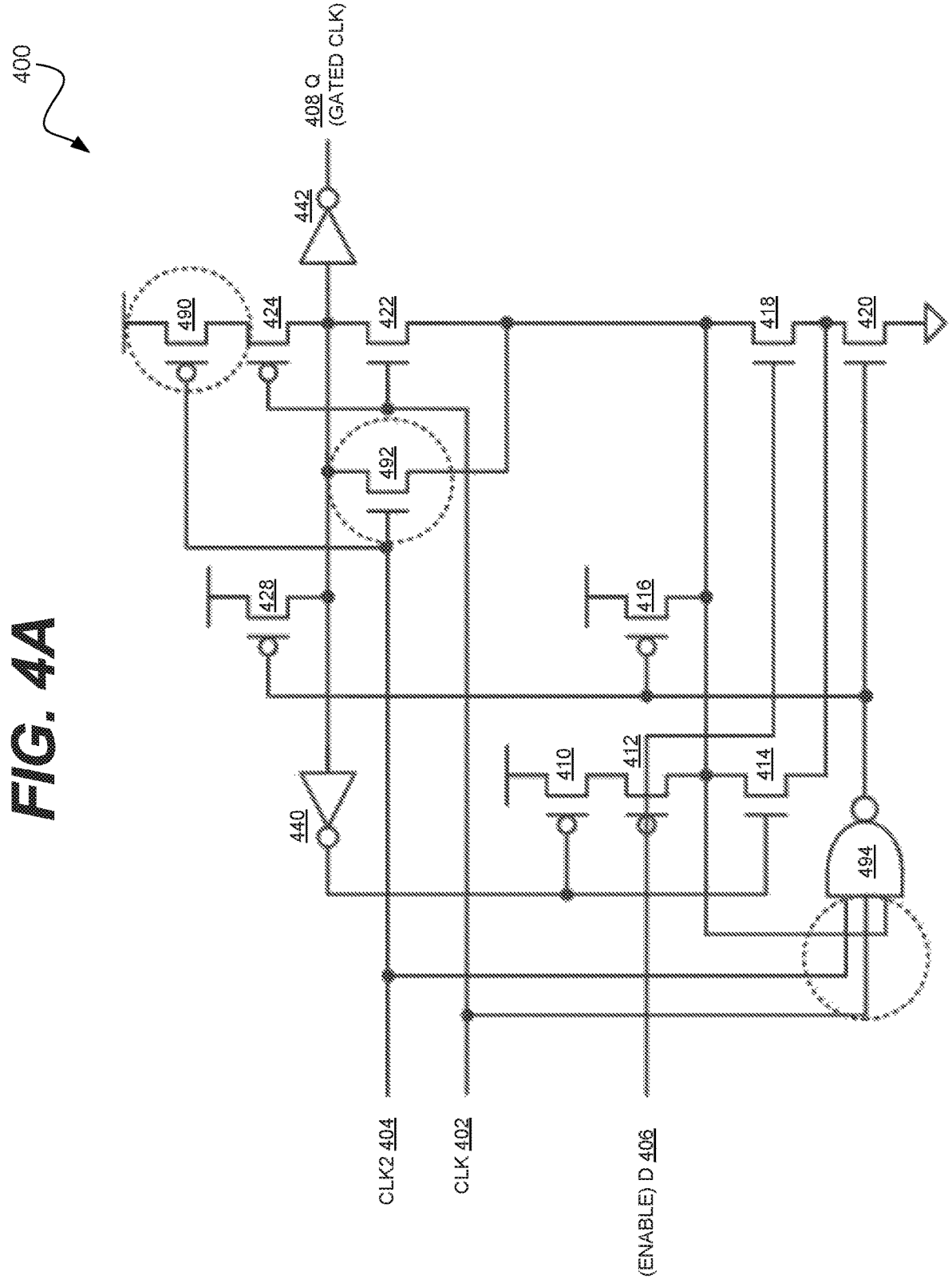
FIGS. 4A and 4B are a block diagrams of an example embodiment of a system in accordance with the disclosed subject matter.
Figure 4B:
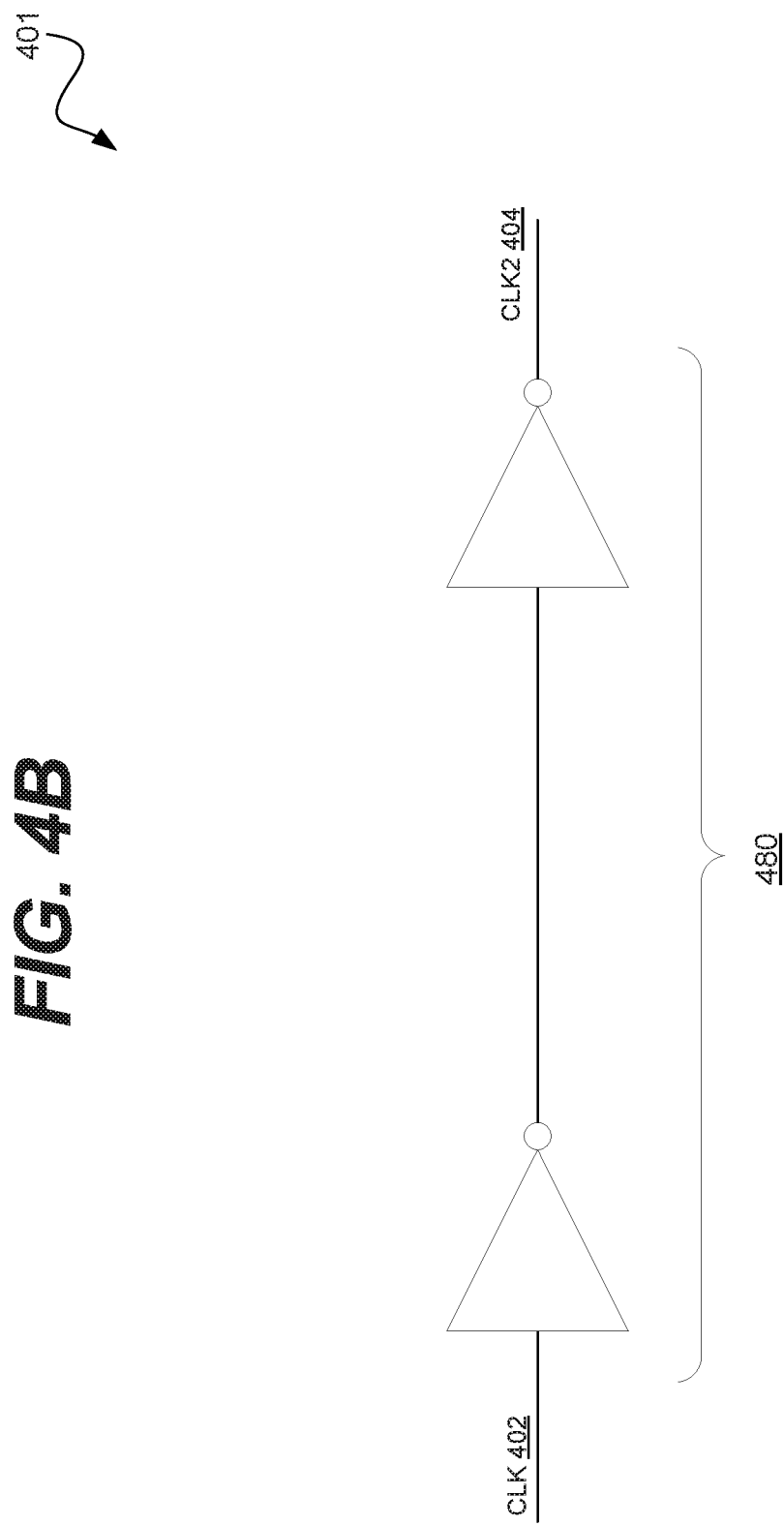

FIGS. 4A and 4B are a block diagrams of an example embodiment of a system 400 and circuit 401 in accordance with the disclosed subject matter. In the illustrated embodiment, the system 400 may include a B-latch ICG that is configured to delay the falling edge of a clock.

In the illustrated embodiment of FIG. 4A, the system 400 includes a circuit that incorporates a self-timed delay off the falling edge of the clock (CLK) 402 to the falling edge of the output Q 408. In such an embodiment, CLK 402 may be essentially or substantially passed to the output Q 408, with timing alterations. In this case, the timing alteration being that falling edge of output Q 408 is delayed or pushed out, similarly to the signals 201 of FIG. 2. In the illustrated embodiment, two wholly new devices (transistors 490 and 492) have been added, and well as a third input to NAND gate 494.

In the illustrated embodiment, a traditional B-latch may include as input the signal D 406 and output the signal Q 408. This latch 400 may be controlled by the clock 402, and the latch 400 may gate CLK 402 (as output Q 408) based, at least in part upon the input enable D 406, as described above. In such an embodiment, the input D 406 may be an enable signal, and the output Q 408 may be a gated version of CLK 402 (based upon the enable D 406, CLK 402, and CLK2 404).

The B-latch 400 may include the following circuits: PMOS (p-channel metal-oxide-semiconductor field-effect transistor) 410, 412, 416, 424, and 428; NMOS (n-channel metal-oxide-semiconductor field-effect transistor) 414, 418, 420, and 422; inverters 440 and 442; and NAND gate 494.

In the illustrated embodiment, the latch 400 may also include a second clock (CLK2) 404. CLK2 404 may be a delayed or altered version of CLK 402. In another embodiment, the signal CLK2 404 may not be directly related to CLK 402. It is understood that the above are merely a few illustrative examples to which the disclosed subject matter is not limited.

In the illustrated embodiment, the second clock CLK2 404 may act as a third input to the NAND gate 494 (along with CLK 402 and input D 406). In addition, the latch 400 may also include two transistors 490 and 492 that are controlled by the second clock CLK2 404 (i.e., coupled with the gate terminal). In the illustrated embodiment, the two transistors 490 and 492 are not in the critical timing path of the latch 400 (CLK 402 to output Q 408), and therefore do not create extra delay for the latch 400, overall.

In the illustrated embodiment, the transistor 490 may include a PMOS transistor coupled between the (high) voltage supply (Vdd), the transistor 424, and the inverse of the output Q 408 (the input to inverter 442). The transistor 490 may be coupled in series with the transistors 418, 420, and 422.

The transistor 492 may include an NMOS transistor coupled between the inverse of the output Q 408 (the input to inverter 442), the transistors 418 and 420, and the ground (or low voltage supply, Vss). Further, transistor 492 may be placed in parallel with transistor 422. The transistor 492 may also be coupled in parallel with transistor 422.

In the illustrated embodiment, the transistors 490 and 492 may be configured to essentially perform a NOR function. While they are not arranged as a traditional NOR gate, the transistors 490 and 492 may be coupled in such a way that if either CLK 402 (controlling transistors 422 and 424) and CLK2 404 (controlling transistors 490 and 492) have the same state, then CLK 402 will be passed to output Q 408. In the illustrated embodiment, the transistors 490 and 492 may be configured to reset the falling edge of the output signal Q 408. In various embodiments, this may be responsive or triggered by the falling edge of CLK 402, if CLK2 404 is derived (e.g., a delayed version) of CLK 402. It is understood that the above is merely one illustrative example to which the disclosed subject matter is not limited.

FIG. 4B illustrates an example circuit 401 for creating the second clock signal CLK2 404. It is understood that the above is merely one illustrative example to which the disclosed subject matter is not limited.

In the illustrated embodiment, the second clock signal CLK2 404 may be created from the first clock signal CLK 402. In such an embodiment, the first clock signal CLK 402 may be delayed by an even number of inverters 480, such that the second clock signal CLK2 404 is substantially the same as the first clock signal CLK 402. In such an embodiment, and ignoring delay, the CLK2 signal 404 may be low when the CLK signal 402 is low and vice versa. In various embodiments, the number of inverters 480 may be adjusted to reach a desired delay or adjust the timing. In such an embodiment, the timing of the resetting of the output signal Q 408 may be adjusted. Again, it is understood that the above is merely one illustrative example to which the disclosed subject matter is not limited.

FIG. 5 is a block diagrams of an example embodiment of a system 500 in accordance with the disclosed subject matter. In the illustrated embodiment, the system 500 may include a dual-output (Q, and Q-Bar or QB) B-latch ICG that is configured to pull-in or hasten the falling edge of a clock.

In the illustrated embodiment of FIG. 5, the system 500 includes a circuit that incorporates a self-timed delay off the rising edge of the clock (CLK) 502 to the falling edge of the outputs Q 508 and QB 508B. In such an embodiment, CLK 502 may be essentially or substantially passed to output Q 508, with timing alterations. In this case, the timing alteration being that falling edge of output Q 508 is hastened or pulled-in, similarly to the signals 200 of FIG. 2. In the illustrated embodiment, three wholly new devices (transistors 590, 591, and 592) have been added.

In the illustrated embodiment, a traditional dual-output B-latch may include as input the signal D 506 and output the signals Q 508 and QB 508B. In the illustrated embodiment, the signal QB 508B may be the inverse of the output Q 508. This latch 500 may be controlled by the clock 502, and the latch 500 may gate CLK 502 (as outputs Q 508 and QB 508B) based, at least in part upon the input enable D 506, as described above. In such an embodiment, the input D 506 may be an enable signal, and the output Q 508 may be a gated version of CLK 502 (based upon the enable D 506, CLK 502, and CLK2 504).

The B-latch 500 may include the following circuits: PMOSs (p-channel metal-oxide-semiconductor field-effect transistor) 525, 526, 535 and 536; NMOSs (n-channel metal-oxide-semiconductor field-effect transistor) 512, 522, 523, 524, 532, 533, and 534; and inverters 544, 546, 554 and 556.

In the illustrated embodiment, the latch 500 may also include a second clock (CLK2) 504. CLK2 504 may be a delayed or altered version of CLK 502. For example, in the illustrated embodiment, the CLK2 504 may be a version of CLK 502 that has been delayed and inverted on odd number of inverter gates. In another embodiment, the signal CLK2 504 may not be directly related to CLK 502. It is understood that the above are merely a few illustrative examples to which the disclosed subject matter is not limited.

In the illustrated embodiment, the latch 500 may also include three transistors 590, 591, and 592 that are controlled by the second clock CLK2 504 (i.e., coupled with the gate terminal). In the illustrated embodiment, the transistors 590, 591, and 592 are not in the critical timing path of the latch 500 (CLK 502 to Q 508 or QB 508B), and therefore do not create extra delay for the latch 500, overall.

In the illustrated embodiment, the transistor 590 may include a PMOS transistor coupled between the (high) voltage supply (Vdd) and the inverse of the output Q 508 (the input to inverter 546). The transistor 591 may include a PMOS transistor coupled between the (high) voltage supply (Vdd) and the inverse of the output QB 508B (the input to inverter 556). The transistors 590 and 591 may respectively be coupled in parallel with the transistors 525, 526, 535, and 536.

The transistor 592 may include an NMOS transistor coupled between a common node (e.g., the source terminal) of transistors 522, 523, 532, and 533, and the ground (or low voltage supply, Vss). The transistor 592 may also be coupled in series with transistor 512.

In the illustrated embodiment, the transistors 590, 591, and 592 may be configured to essentially perform a NAND function. While they are not arranged as a traditional NAND gate, the transistors 590, 591, and 592 may be coupled in such a way that unless both CLK 502 (controlling transistors 512, 526, and 536) and CLK2 504 (controlling transistors 590, 591, and 592) have the same state then CLK 502 will not be passed to Q 508 (and QB 508B). In the illustrated embodiment, the transistors 590, 591, and 592 may be configured to reset the falling edge of the output signal Q 508. In various embodiments, this may be responsive or triggered by the rising edge of CLK 502, if CLK2 504 is derived (e.g., an inverse) of CLK 502. It is understood that the above is merely one illustrative example to which the disclosed subject matter is not limited.

Figure 6A:
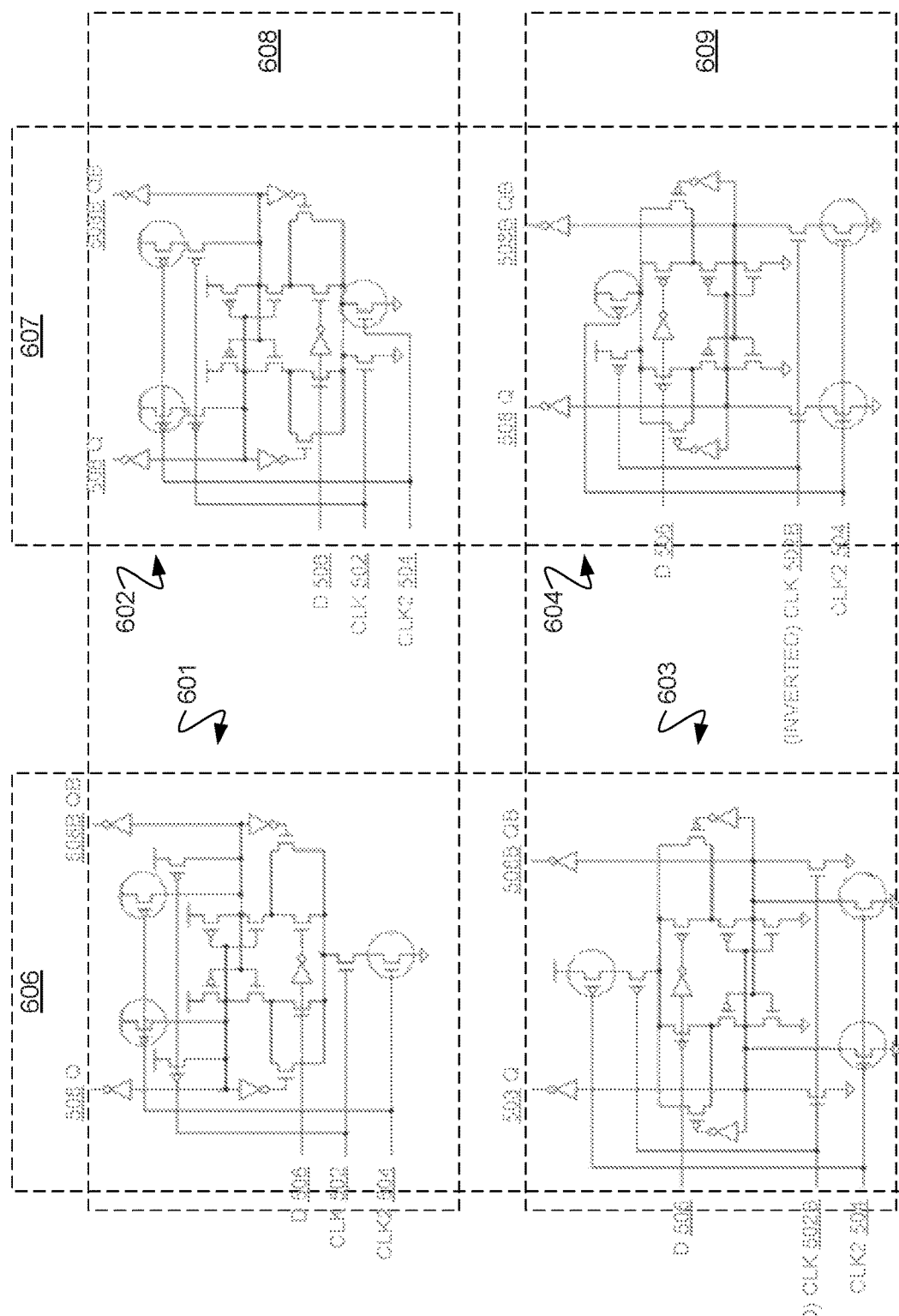
FIG. 6A is a block diagram of an example embodiment of systems in accordance with the disclosed subject matter.

FIG. 6A is a block diagram of an example embodiment of systems 601, 602, 603, and 604 in accordance with the disclosed subject matter. In the illustrated embodiment, a number of dual-output latch circuits are shown.

In the illustrated embodiment, each of the latches 601, 602, 603, and 604 may be configured to pass a clock signal to the output signals (in inverted and non-inverted form). The latches 601, 602, 603, and 604 may be configured to gate the clock based upon an enable signal, as described above.

Further, in various embodiments, the latches 601, 602, 603, and 604 may be configured to alter the timing of the passing of the clock signal based upon a second clock, as described above. In such an embodiment, the alternation may include pulling-in or hastening the trailing edge of the first clock signal, or delaying or pushing out the trailing edge of the first clock signal, as described above. In various embodiments, this may be described as resetting the output signals.

As described above in reference to FIG. 5, each of the latches 601, 602, 603, and 604 may include the three aforementioned transistors (circled). In various embodiments, these transistors may, depending upon the embodiment, essentially perform either a NAND or NOR function, as described above. Likewise, these transistors may be placed outside the critical paths of the latches.

In the illustrated embodiment, the latches 601, 602, 603, and 604 are grouped according to function. Group 606 may include latches 601 and 603. The latches 601 and 603 may both be configured to hasten or pull-in the trailing edge of the output signal. In such an embodiment, this may include the self-timing delay from the leading or first edge of the first clock (CLK) signal. In such an embodiment, the second clock (CLK2) may be created by the application of an odd number of inverters to the first clock (CLK).

Group 607 may include latches 602 and 604. The latches 602 and 604 may both be configured to delay or push-out the trailing edge of the output signal. In such an embodiment, this may include the self-timing delay from the trailing or second edge of the first clock (CLK) signal. In such an embodiment, the second clock (CLK2) may be created by the application of an even number of inverters to the first clock (CLK).

Group 608 includes latches 601 and 602. Both latches 601 and 602 are B-latches which are closed when the first clock (CLK) is high or active.

Conversely, Group 609 includes latches 603 and 604. Both latches 601 and 602 are A-latches which are closed when the first clock (CLK) is low or inactive.

Figure 6B:
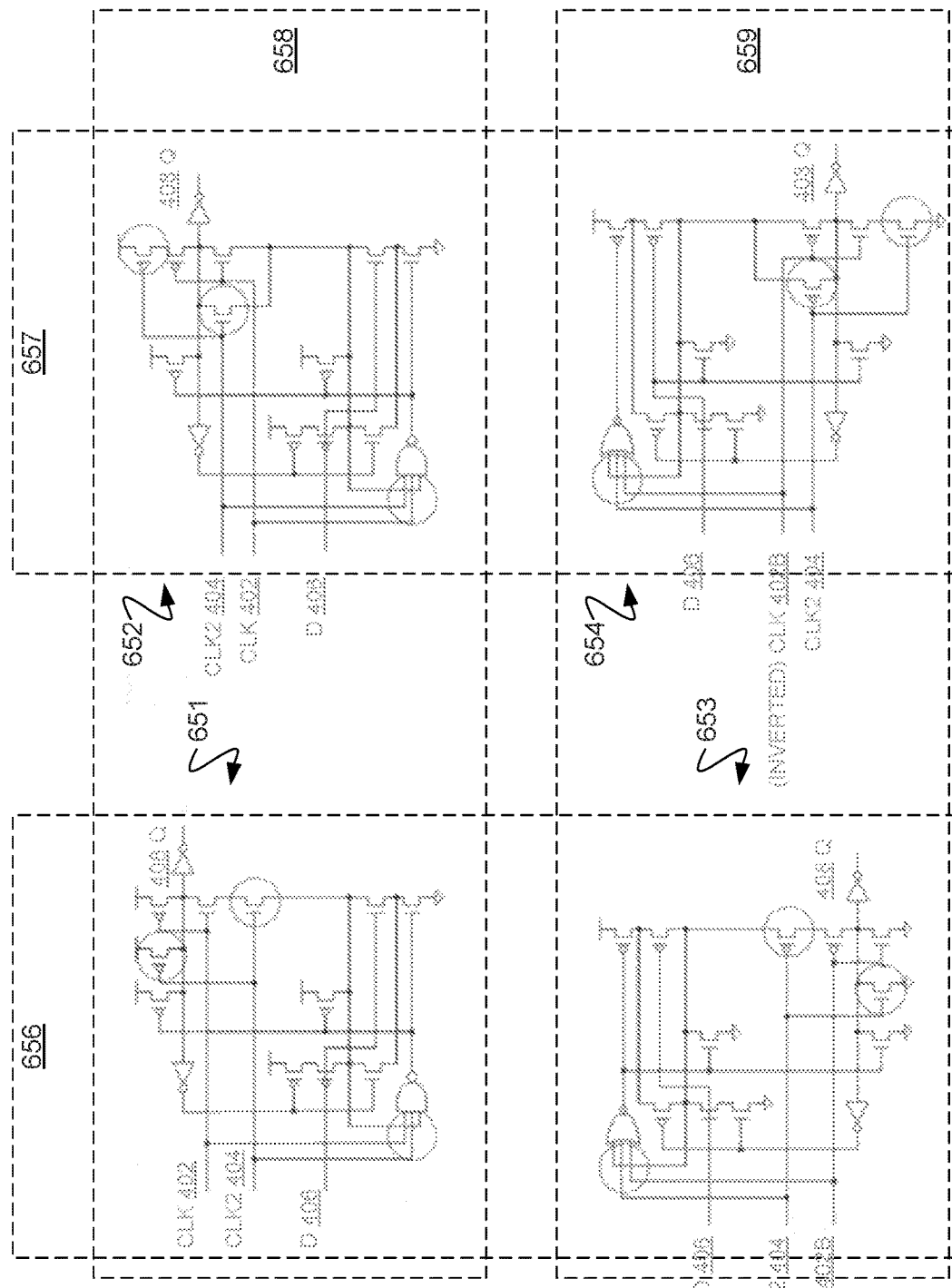
FIG. 6B is a block diagram of an example embodiment of systems in accordance with the disclosed subject matter.

FIG. 6B is a block diagram of an example embodiment of systems 651, 652, 653, and 654 in accordance with the disclosed subject matter. In the illustrated embodiment, a number of single-output latch circuits are shown.

In the illustrated embodiment, each of the latches 651, 652, 653, and 654 may be configured to pass a clock signal to the output signal. The latches 651, 652, 653, and 654 may be configured to gate the clock based upon an enable signal, as described above.

Further, in various embodiments, the latches 651, 652, 653, and 654 may be configured to alter the timing of the passing of the clock signal based upon a second clock, as described above. In such an embodiment, the alternation may include pulling-in or hastening the trailing edge of the first clock signal, or delaying or pushing out the trailing edge of the first clock signal, as described above. In various embodiments, this may be described as resetting the output signals.

As described above in reference to FIGS. 3A and 4A, each of the latches 651, 652, 653, and 654 may include the aforementioned transistors (circled) and additional input to the Boolean gate (circled). In various embodiments, these transistors may, depending upon the embodiment, essentially perform either a NAND or NOR function, as described above. Likewise, these transistors may be placed outside the critical paths of the latches.

In the illustrated embodiment, the latches 651, 652, 653, and 654 are grouped according to function. Group 656 may include latches 651 and 653. The latches 651 and 653 may both be configured to hasten or pull-in the trailing edge of the output signal. In such an embodiment, this may include the self-timing delay from the leading or first edge of the first clock (CLK) signal. In such an embodiment, the second clock (CLK2) may be created by the application of an odd number of inverters to the first clock (CLK).

Group 657 may include latches 652 and 654. The latches 652 and 654 may both be configured to delay or push-out the trailing edge of the output signal. In such an embodiment, this may include the self-timing delay from the trailing or second edge of the first clock (CLK) signal. In such an embodiment, the second clock (CLK2) may be created by the application of an even number of inverters to the first clock (CLK).

Group 658 includes latches 651 and 652. Both latches 651 and 652 are B-latches which are closed when the first clock (CLK) is high or active. Also, latches 651 and 652 may include a NAND gate (circled) that additionally receives the second clock (CLK2) as a third input.

Conversely, Group 659 includes latches 653 and 654. Both latches 651 and 652 are A-latches which are closed when the first clock (CLK) is low or inactive. Also, latches 651 and 652 may include a NOR gate (circled) that additionally receives the second clock (CLK2) as a third input.

Figure 7:
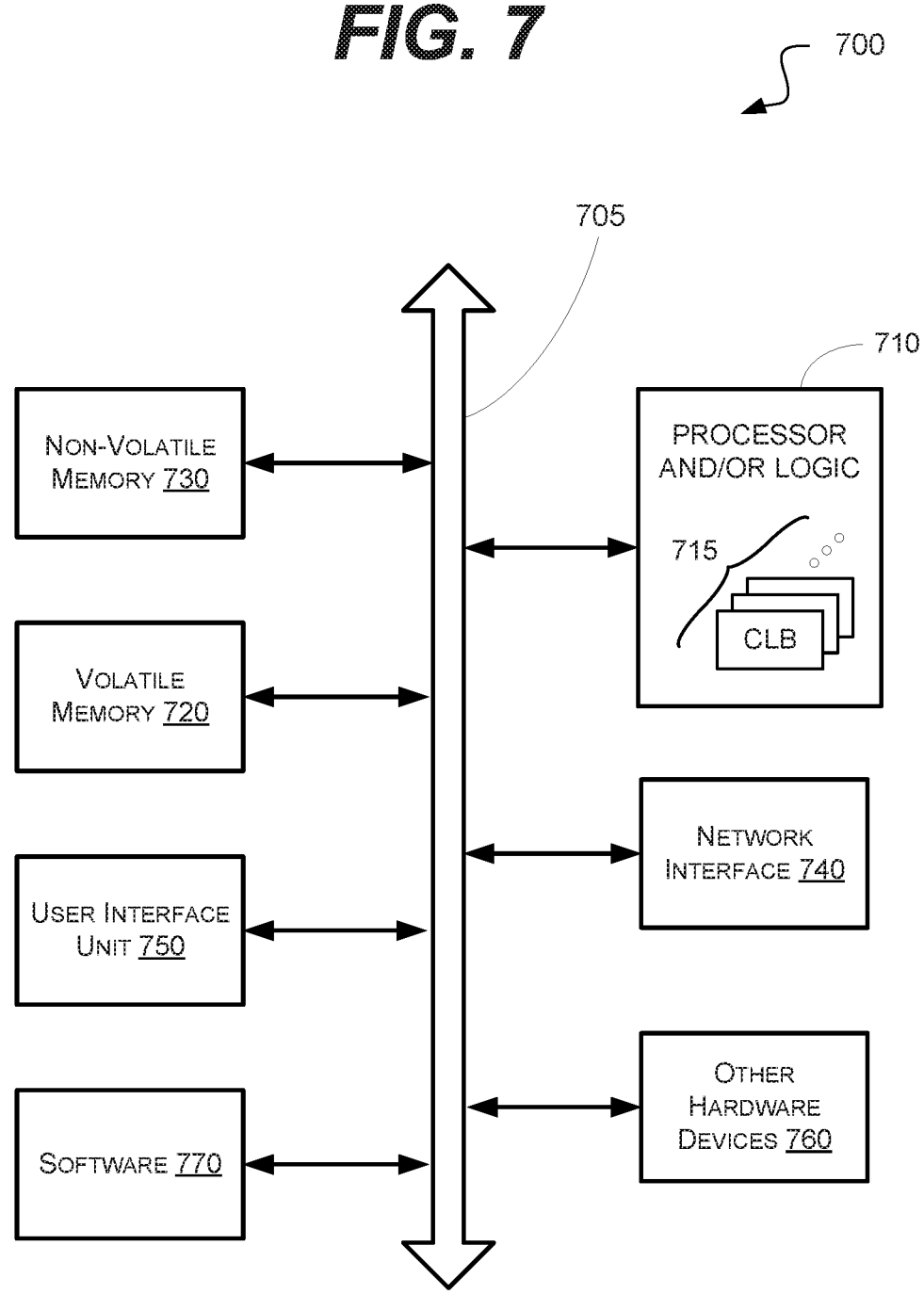
FIG. 7 is a schematic block diagram of an information processing system that may include devices formed according to principles of the disclosed subject matter.

FIG. 7 is a schematic block diagram of an information processing system 700, which may include semiconductor devices formed according to principles of the disclosed subject matter.

Referring to FIG. 7, an information processing system 700 may include one or more of devices constructed according to the principles of the disclosed subject matter. In another embodiment, the information processing system 700 may employ or execute one or more techniques according to the principles of the disclosed subject matter.

In various embodiments, the information processing system 700 may include a computing device, such as, for example, a laptop, desktop, workstation, server, blade server, personal digital assistant, smartphone, tablet, and other appropriate computers or a virtual machine or virtual computing device thereof. In various embodiments, the information processing system 700 may be used by a user (not shown).

The information processing system 700 according to the disclosed subject matter may further include a central processing unit (CPU), logic, or processor 710. In some embodiments, the processor 710 may include one or more functional unit blocks (FUBs) or combinational logic blocks (CLBs) 715. In such an embodiment, a combinational logic block may include various Boolean logic operations (e.g., NAND, NOR, NOT, XOR), stabilizing logic devices (e.g., flip-flops, latches), other logic devices, or a combination thereof. These combinational logic operations may be configured in simple or complex fashion to process input signals to achieve a desired result. It is understood that while a few illustrative examples of synchronous combinational logic operations are described, the disclosed subject matter is not so limited and may include asynchronous operations, or a mixture thereof. In one embodiment, the combinational logic operations may comprise a plurality of complementary metal oxide semiconductors (CMOS) transistors. In various embodiments, these CMOS transistors may be arranged into gates that perform the logical operations; although it is understood that other technologies may be used and are within the scope of the disclosed subject matter.

The information processing system 700 according to the disclosed subject matter may further include a volatile memory 720 (e.g., a Random Access Memory (RAM)). The information processing system 700 according to the disclosed subject matter may further include a non-volatile memory 730 (e.g., a hard drive, an optical memory, a NAND or Flash memory). In some embodiments, either the volatile memory 720, the non-volatile memory 730, or a combination or portions thereof may be referred to as a "storage medium". In various embodiments, the volatile memory 720 and/or the non-volatile memory 730 may be configured to store data in a semi-permanent or substantially permanent form.

In various embodiments, the information processing system 700 may include one or more network interfaces 740 configured to allow the information processing system 700 to be part of and communicate via a communications network. Examples of a Wi-Fi protocol may include, but are not limited to, Institute of Electrical and Electronics Engineers (IEEE) 802.11g, IEEE 802.11n. Examples of a cellular protocol may include, but are not limited to: IEEE 802.16m (a.k.a. Wireless-MAN (Metropolitan Area Network) Advanced, Long Term Evolution (LTE) Advanced, Enhanced Data rates for GSM (Global System for Mobile Communications) Evolution (EDGE), Evolved High-Speed Packet Access (HSPA+). Examples of a wired protocol may include, but are not limited to, IEEE 802.3 (a.k.a. Ethernet), Fibre Channel, Power Line communication (e.g., HomePlug, IEEE 1901). It is understood that the above are merely a few illustrative examples to which the disclosed subject matter is not limited.

The information processing system 700 according to the disclosed subject matter may further include a user interface unit 750 (e.g., a display adapter, a haptic interface, a human interface device). In various embodiments, this user interface unit 750 may be configured to either receive input from a user and/or provide output to a user. Other kinds of devices may be used to provide for interaction with a user as well; for example, feedback provided to the user may be any form of sensory feedback, e.g., visual feedback, auditory feedback, or tactile feedback; and input from the user may be received in any form, including acoustic, speech, or tactile input.

In various embodiments, the information processing system 700 may include one or more other devices or hardware components 760 (e.g., a display or monitor, a keyboard, a mouse, a camera, a fingerprint reader, a video processor). It is understood that the above are merely a few illustrative examples to which the disclosed subject matter is not limited.

The information processing system 700 according to the disclosed subject matter may further include one or more system buses 705. In such an embodiment, the system bus 705 may be configured to communicatively couple the processor 710, the volatile memory 720, the non-volatile memory 730, the network interface 740, the user interface unit 750, and one or more hardware components 760. Data processed by the processor 710 or data inputted from outside of the non-volatile memory 730 may be stored in either the non-volatile memory 730 or the volatile memory 720.

In various embodiments, the information processing system 700 may include or execute one or more software components 770. In some embodiments, the software components 770 may include an operating system (OS) and/or an application. In some embodiments, the OS may be configured to provide one or more services to an application and manage or act as an intermediary between the application and the various hardware components (e.g., the processor 710, a network interface 740) of the information processing system 700. In such an embodiment, the information processing system 700 may include one or more native applications, which may be installed locally (e.g., within the non-volatile memory 730) and configured to be executed directly by the processor 710 and directly interact with the OS. In such an embodiment, the native applications may include pre-compiled machine executable code. In some embodiments, the native applications may include a script interpreter (e.g., C shell (csh), AppleScript, AutoHotkey) or a virtual execution machine (VM) (e.g., the Java Virtual Machine, the Microsoft Common Language Runtime) that are configured to translate source or object code into executable code which is then executed by the processor 710.

The semiconductor devices described above may be encapsulated using various packaging techniques. For example, semiconductor devices constructed according to principles of the disclosed subject matter may be encapsulated using any one of a package on package (POP) technique, a ball grid arrays (BGAs) technique, a chip scale packages (CSPs) technique, a plastic leaded chip carrier (PLCC) technique, a plastic dual in-line package (PDIP) technique, a die in waffle pack technique, a die in wafer form technique, a chip on board (COB) technique, a ceramic dual in-line package (CERDIP) technique, a plastic metric quad flat package (PMQFP) technique, a plastic quad flat package (PQFP) technique, a small outline package (SOIC) technique, a shrink small outline package (SSOP) technique, a thin small outline package (TSOP) technique, a thin quad flat package (TQFP) technique, a system in package (SIP) technique, a multi-chip package (MCP) technique, a wafer-level fabricated package (WFP) technique, a wafer-level processed stack package (WSP) technique, or other technique as will be known to those skilled in the art.

Method steps may be performed by one or more programmable processors executing a computer program to perform functions by operating on input data and generating output. Method steps also may be performed by, and an apparatus may be implemented as, special purpose logic circuitry, e.g., an FPGA (field programmable gate array) or an ASIC (application-specific integrated circuit).

In various embodiments, a computer readable medium may include instructions that, when executed, cause a device to perform at least a portion of the method steps. In some embodiments, the computer readable medium may be included in a magnetic medium, optical medium, other medium, or a combination thereof (e.g., CD-ROM, hard drive, a read-only memory, a flash drive). In such an embodiment, the computer readable medium may be a tangibly and non-transitorily embodied article of manufacture.

While the principles of the disclosed subject matter have been described with reference to example embodiments, it will be apparent to those skilled in the art that various changes and modifications may be made thereto without departing from the spirit and scope of these disclosed concepts. Therefore, it should be understood that the above embodiments are not limiting but are illustrative only. Thus, the scope of the disclosed concepts is to be determined by the broadest permissible interpretation of the following claims and their equivalents, and should not be restricted or limited by the foregoing description. It is, therefore, to be understood that the appended claims are intended to cover all such modifications and changes as fall within the scope of the embodiments.

What is claimed is:

1. An apparatus, comprising:
   a latch circuit comprising a NAND gate that receives a first clock signal and a second clock signal as inputs, the latch circuit being configured to, depending in part upon a state of an enable signal, substantially pass the first clock signal to an output signal, the first clock signal comprising a first rising edge and a first falling edge and the output signal comprising a second rising edge and a second falling edge, the latch circuit further comprising:
   at least two transistors configured to essentially perform a NAND function in which an input to each of the at least two transistors comprises the second clock signal that is a delayed and inverted version of the first clock signal, the at least two transistors being configured to alter a timing of the second falling edge with respect to the first rising edge in response to a falling edge of the second clock signal.

2. The apparatus of claim 1, wherein the at least two transistors are configured to hasten the second falling edge with respect to the first rising edge.

3. The apparatus of claim 1, wherein the at least two transistors comprise:
   a first transistor coupled between a high voltage power supply and an output inverter configured to supply the output signal; and
   a second transistor coupled between the output inverter and a low voltage power supply.

4. The apparatus of claim 3, wherein the first transistor comprises a PMOS transistor, and the second transistor comprises an NMOS transistor, and wherein the at least two transistors are configured to hasten a reset of the second falling edge of the output signal with respect to the first rising edge of the first clock signal.

5. The apparatus of claim 3, wherein the first transistor is coupled in parallel with at least one other transistor that is controlled by the first clock signal,
   wherein the second transistor is coupled in series with a second at least one other transistor that is controlled by the first clock signal, and
   wherein the at least two transistors are configured to hasten a reset of the second falling edge of the output signal with respect to the first rising edge of the first clock signal.

6. The apparatus of claim 1, wherein the at least two transistors are not in a critical timing path of the latch circuit.

7. A system, comprising:
   a clock generator circuit configured to generate a first clock signal;
   a clock gater circuit comprising a NAND gate that receives the first clock signal and a second clock signal, the clock gater circuit being configured to receive an enable signal as an input, and to generate a third clock signal, the first clock signal comprising a first leading edge and a first trailing edge and the third clock signal comprising a second leading edge and a second trailing edge; and
   a logic circuit configured to perform a logic function synchronized, at least in part by the third clock signal; and
   wherein the clock gater circuit is configured to, depending in part upon a state of the enable signal, substantially pass the first clock signal to the third clock signal, and
   wherein the clock gater circuit comprises at least two transistors configured to be controlled by the second clock signal and alter a timing of the second trailing edge with respect to the first trailing edge in response to a falling edge of the second clock signal.

8. The system of claim 7, wherein the second clock signal is configured to provide a self-timing mechanism that alters the timing of the second trailing edge of the third clock signal relative to the first trailing edge of the first clock signal; and
   wherein the at least two transistors are configured to reset the third clock signal based upon a logical combination of the first clock signal and the second clock signal, and are coupled within the clock gater circuit outside of a critical timing path between the first clock signal and the third clock signal.

* * * * *